(12) United States Patent
Koyama

(10) Patent No.: US 9,008,983 B2
(45) Date of Patent: Apr. 14, 2015

(54) WAVEGUIDE, APPARATUS INCLUDING THE WAVEGUIDE, AND METHOD OF MANUFACTURING THE WAVEGUIDE

(75) Inventor: Yasushi Koyama, Kamakura (JP)

(73) Assignee: Canon Kabushiki Kaisha, Tokyo (JP)

(*) Notice: Subject to any disclaimer, the term of this patent is extended or adjusted under 35 U.S.C. 154(b) by 454 days.

(21) Appl. No.: 13/456,718

(22) Filed: Apr. 26, 2012

(65) Prior Publication Data

US 2012/0296589 A1  Nov. 22, 2012

(30) Foreign Application Priority Data

May 17, 2011 (JP) ................................. 2011-110888

(51) Int. Cl.

| | |
|---|---|
| *G06F 19/00* | (2011.01) |
| *G01R 29/00* | (2006.01) |
| *H01P 11/00* | (2006.01) |
| *H01P 3/00* | (2006.01) |
| *H01S 1/02* | (2006.01) |
| *B82Y 20/00* | (2011.01) |
| *H01S 5/02* | (2006.01) |

(Continued)

(52) U.S. Cl.
CPC . *H01S 1/02* (2013.01); *B82Y 20/00* (2013.01); *H01S 5/0215* (2013.01); *H01S 5/0217* (2013.01); *H01S 5/2018* (2013.01); *H01S 5/3401* (2013.01); *H01S 2302/02* (2013.01)

(58) Field of Classification Search
CPC . H01S 2302/02; H01S 5/0425; H01S 5/1046; H01S 5/1228; H01S 5/3214; H01S 5/3402; H01S 5/3412; H01S 5/34306; H01S 1/02; H01S 5/0215; H01S 5/0217; H01S 5/2018; H01S 5/3401; G02B 6/10; G02B 6/1226; B82Y 20/00

USPC ............ 702/66; 250/338.4, 493.1; 372/45.01; 385/129

See application file for complete search history.

(56) References Cited

U.S. PATENT DOCUMENTS

| | | | |
|---|---|---|---|
| 7,693,198 B2 | 4/2010 | Sekiguchi et al. | |
| 8,805,147 B2 * | 8/2014 | Koyama | 385/129 |

(Continued)

FOREIGN PATENT DOCUMENTS

WO    2008/012527 A1    1/2008

OTHER PUBLICATIONS

Benjamin S. Williams et al., "Terahertz Quantum-Cascade Laser at λ ≈ 100µm Using Metal Waveguide for Mode Confinement," 83(11) Appl. Phys. Lett. 2124-2126 (Sep. 2003).

(Continued)

*Primary Examiner* — John H Le

(74) *Attorney, Agent, or Firm* — Fitzpatrick, Cella, Harper & Scinto

(57) ABSTRACT

Provided are a waveguide capable of suppressing strain and defect caused in a semiconductor in an initial stage or during operation due to a manufacturing process or the like to realize improvement and stabilization of characteristics such as oscillation characteristics, and a method of manufacturing the waveguide. A waveguide includes a first conductor layer and a second conductor layer that are composed of a negative dielectric constant medium having a negative real part of dielectric constant with respect to an electromagnetic wave in a waveguide mode, and a core layer that is in contact with and placed between the first conductor layer and the second conductor layer, and includes a semiconductor portion. At least the first conductor layer has a particular depressed and projected structure extending in an in-plane direction.

13 Claims, 7 Drawing Sheets

(51) Int. Cl.
*H01S 5/20* (2006.01)
*H01S 5/34* (2006.01)

(56) References Cited

U.S. PATENT DOCUMENTS

| | | |
|---|---|---|
| 2011/0101250 A1 | 5/2011 | Hu |
| 2012/0292512 A1 | 11/2012 | Koyama |
| 2013/0063159 A1 | 3/2013 | Koyama |

OTHER PUBLICATIONS

Bo Li et al., "Development of a Novel GaAs Micromachined Accelerometer Based on Resonant Tunneling Diodes," 143 (2) Sensors and Actuators A: Physical 230-236 (May 2008).
Office Action in Chinese Application No. 201210148481.1 (dated Apr. 1, 2014).
U.S. Appl. No. 13/461,297, filed May 1, 2012.
U.S. Appl. No. 13/599,708, filed Aug. 30, 2012.

* cited by examiner

US 9,008,983 B2

WAVEGUIDE, APPARATUS INCLUDING THE WAVEGUIDE, AND METHOD OF MANUFACTURING THE WAVEGUIDE

BACKGROUND OF THE INVENTION

1. Field of the Invention

The present invention relates to a waveguide and a method of manufacturing the same. More particularly, the present invention relates to a waveguide for electromagnetic wave in a frequency band from a millimeter wave band to a terahertz wave band (30 GHz to 30 THz) (hereinafter, also referred to as terahertz wave).

2. Description of the Related Art

In the frequency band of terahertz wave, there are absorption peaks of many organic molecules of biological materials, medicines, electronic materials, and the like stemming from the structures and states thereof. Further, terahertz wave easily penetrates materials such as paper, ceramic, a resin, and cloth. In recent years, research and development have been conducted on imaging technology and sensing technology which makes use of such characteristics of terahertz wave. For example, application thereof to a safe fluoroscopic inspection apparatus to replace an X-ray apparatus, to an in-line non-destructive inspection apparatus in a manufacturing process, and the like is expected.

As a current injection type terahertz wave light source, a structure is under study, which uses an electromagnetic wave gain based on intersubband transition of electrons in a semiconductor quantum well structure. Appl. Phys. Lett. 83, 2124 (2003) proposes a terahertz wave band quantum cascade laser (hereinafter, also referred to as QCL) in which double-side metal waveguides (hereinafter, also referred to as DMW) which are known as low loss waveguides are integrated as resonators. This element attains laser oscillation around 3 THz by excellent light confinement and low loss propagation by guiding a terahertz wave that is inductively emitted to a resonator structure in which a metal is placed above and below a gain medium formed of a semiconductor thin film of a thickness of about 10 μm in a surface plasmon mode.

On the other hand, a multiple quantum well structure is known to change the characteristics thereof owing to strain applied thereto. In Sensors and Actuators, A, 143 (2008), 230-236, a report is made that the characteristics of a resonant tunnel diode (hereinafter, also referred to as RTD) change owing to strain applied thereto. In Sensors and Actuators, A, 143 (2008), 230-236, change of about twice in negative differential resistance at a stress of near 100 MPa is observed. Further, a laser device with a waveguide as described in U.S. Pat. No. 7,693,198 is disclosed.

The DMW disclosed in Appl. Phys. Lett. 83, 2124 (2003) has a structure in which two metal layers sandwich a semiconductor thin film having a thickness of about 10 μm, and the DMW is manufactured by transferring the semiconductor thin film onto a different substrate using a metal bonding technology or the like. On the other hand, a structure in which thin film materials having different lattice constants and different thermal expansion coefficients are laminated is generally known to be liable to cause a residual stress therein due to the manufacturing process. Therefore, in a conventional structure, strain or defect due to the manufacturing process or the like may change the characteristics of the semiconductor thin film which is a gain medium to cause deterioration or instability of the oscillation characteristics.

SUMMARY OF THE INVENTION

The present invention has been made in view of the above-mentioned problem. A waveguide according to the present invention includes a first conductor layer and a second conductor layer that are composed of a negative dielectric constant medium having a negative real part of dielectric constant with respect to an electromagnetic wave in a waveguide mode, and a core layer that is in contact with and placed between the first conductor layer and the second conductor layer, and includes a semiconductor portion. At least the first conductor layer has a depressed and projected structure which extends in an in-plane direction, and besides at least one of the following requirements is satisfied; (1) the depressed and projected structure is arranged in a direction perpendicular to a propagation direction of the electromagnetic wave in the waveguide mode, and has plural projected portions, (2) the depressed and projected structure has a pitch length less than $\lambda g/2$ where $\lambda g = \lambda/n_e$, $\lambda$ is a wavelength of the electromagnetic wave, and $n_e$ is an equivalent refractive index of the waveguide, and (3) the depressed and projected structure has a pitch length less than 100 μm.

Further, the present invention has been made in view of the above-mentioned problem. A method of manufacturing the waveguide according to the present invention includes: preparing a first substrate having a semiconductor layer on an upper surface thereof; transferring the semiconductor layer onto an upper surface of a second substrate via a first conductor layer having a depressed and projected structure extending in an in-plane direction; and forming a second conductor layer on an upper surface of the semiconductor layer.

In the waveguide according to the present invention, the first conductor layer having the depressed and projected structure provided therein which is prone to plastic deformation may be used as a bonding layer, and thus, the semiconductor film may be transferred at a relatively low temperature under a relatively low load. Further, by devising the size and arrangement of the depressed portions and the projected portions in the depressed and projected structure so as to satisfy any one of the following three conditions, influence of the waveguide such as a DMW on a resonance electric field and the like may be suppressed: (1) the depressed and projected structure is arranged in the direction perpendicular to the propagation direction of the electromagnetic wave in the waveguide mode, and has the plural projected portions; (2) the depressed and projected structure has the pitch length less than $\lambda g/2$ where $\lambda g = \lambda/n_e$, $\lambda$ is the wavelength of the electromagnetic wave, and $n_e$ is the equivalent refractive index of the waveguide; and (3) the depressed and projected structure has the pitch length less than 100 μm. This realizes an element such as an oscillator which operates stably in a frequency band such as a terahertz wave band through reduction of the transfer-caused residual strain of a semiconductor portion, such as an active layer, which has been a problem to be solved, while maintaining a resonant structure and the like. In this way, there may be provided a semiconductor element which has reduced strain and defect due to the manufacturing process or the like and operates stably in a frequency band such as a terahertz wave band, and a method of manufacturing the semiconductor element.

Further features of the present invention will become apparent from the following description of exemplary embodiments with reference to the attached drawings.

DESCRIPTION OF THE EMBODIMENTS

The present invention relates to a waveguide including a core layer sandwiched between two conductor layers of a negative dielectric constant medium for defining the waveguide, in which at least one of the conductor layers has a depressed and projected structure that extends in an in-plane direction. Further, at least one of the following requirements is satisfied: (1) the depressed and projected structure is arranged in a direction perpendicular to a propagation direction of the electromagnetic wave in the waveguide mode, and has multiple projected portions; (2) the depressed and projected structure has a pitch length less than $\lambda g/2$ where $\lambda g=\lambda/n_e$, $\lambda$ is a wavelength of the electromagnetic wave, and $n_e$ is an equivalent refractive index of the waveguide; and (3) the depressed and projected structure has a pitch length less than 100 µm.

The depressed and projected structure may be a through groove which passes through the conductor layer in a thickness direction, a blind groove obtained by digging down the conductor layer halfway in the thickness direction, a hollow portion provided in the conductor layer, or the like. A depressed portion formed of a groove or a hollow portion may be a space as it is, and may be a space filled with a substance. According to the present invention, bonding at a lower temperature under a lower load may be carried out with the depressed and projected structure of the conductor layer which is prone to plastic deformation, and any kind of the depressed and projected structure may be formed in the conductor layer insofar as such bonding can be carried out. The waveguide according to the present invention may be used as a simple waveguide for electromagnetic wave, and, as described in an embodiment and examples in the following, the core layer of the waveguide may have an electromagnetic wave gain portion to form an oscillator, an electromagnetic wave detecting element, an electromagnetic wave amplifying element, or the like. Further, in order to further enhance the effect of the present invention, the other one of the conductor layers and the core layer may have a depressed and projected structure that extends in an in-plane direction so that strain and defect caused in the semiconductor portion of the core layer can be further suppressed.

A waveguide, an element including the same, and a method of manufacturing the waveguide according to an embodiment and examples of the present invention are described in the following with reference to the attached drawings.

Embodiment

Figure 1A:
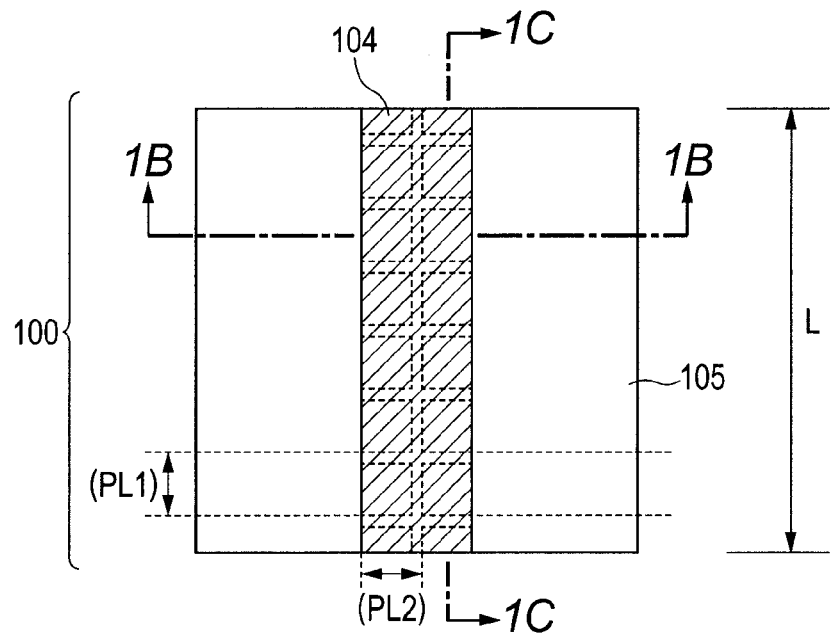
FIGS. 1A, 1B and 1C are views illustrating an element according to an embodiment and Example 1 of the present invention.
Figure 1B:
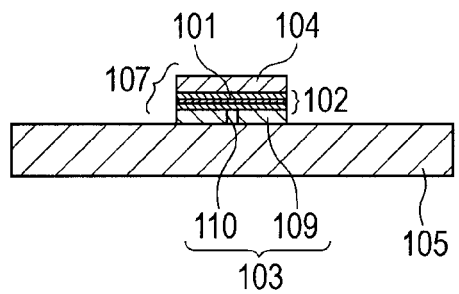
Figure 1C:
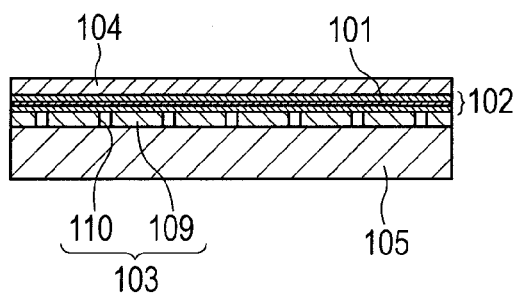
Figure 2A:
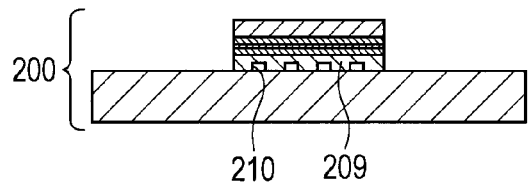
FIGS. 2A, 2B, 2C, 2D, 2E, 2F and 2G are views illustrating various kinds of modified examples of the element according to the embodiment of the present invention.
Figure 2B:
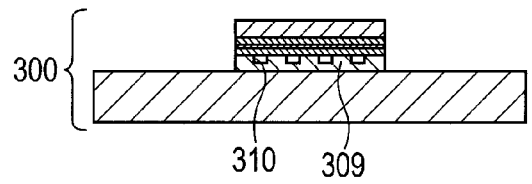
Figure 2C:
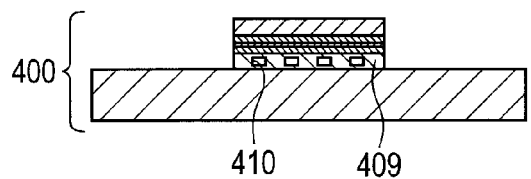
Figure 2D:
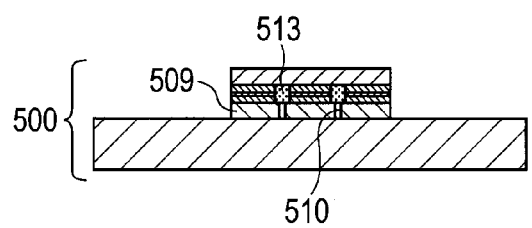
Figure 2E:
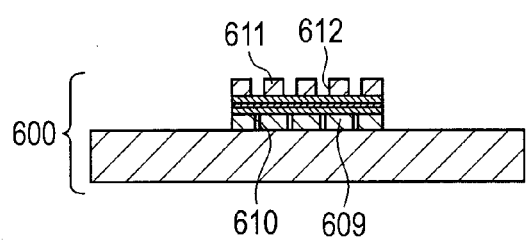
Figure 2F:
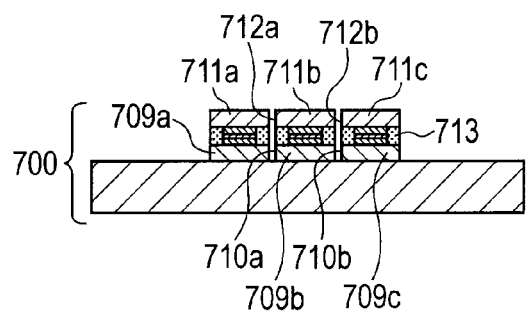
Figure 2G:
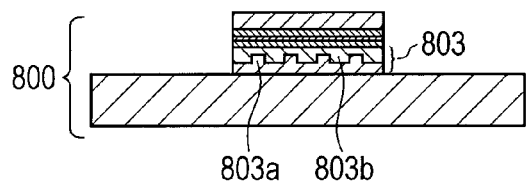
Figure 3A:
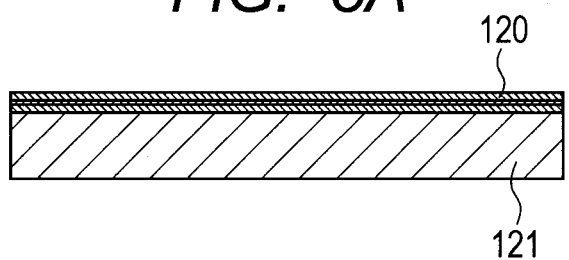
FIGS. 3A, 3B, 3C and 3D are views illustrating an example of a method of manufacturing the element according to the present invention.
Figure 3B:
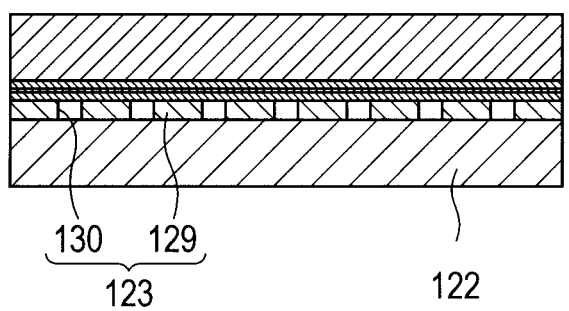
Figure 3C:
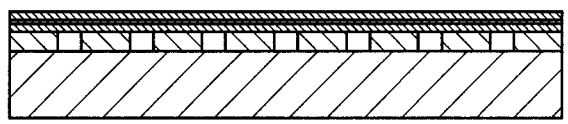
Figure 3D:
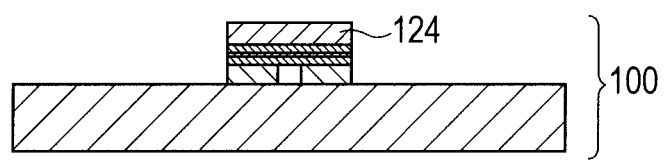

An oscillator 100 including a waveguide according to an embodiment of the present invention is described with reference to FIGS. 1A to 1C. FIG. 1A is a plan view, FIG. 1B is a sectional view taken along the line 1B-1B of FIG. 1A, and FIG. 1C is a sectional view taken along the line 1C-1C of FIG. 1A.

The oscillator 100 is a laser device having as a resonator a waveguide 107 including a core layer 102 having an electromagnetic wave gain, and a first metal layer 103 and a second metal layer 104 which are conductor layers of a negative dielectric constant medium having a negative real part of dielectric constant with respect to an electromagnetic wave in a waveguide mode. The oscillator 100 is mounted on a substrate 105. In this embodiment, the waveguide 107 is an optical waveguide, which is called a DMW, in which the first metal layer 103 and the second metal layer 104 which are clads in proximity to each other sandwich the core layer 102. The distance between the first metal layer 103 and the second metal layer 104 is as small as $\lambda g/2$ or smaller, preferably as small as $\lambda g/10$ or lower, where $\lambda g$ is the guide wavelength of the oscillator 100 in an oscillation mode. In this way, an electromagnetic wave in a frequency band of terahertz wave propagates through the waveguide 107 in a surface plasmon mode in which no diffraction limit exists. The guide wavelength $\lambda g$ is expressed by $\lambda g=\lambda/n_e$, where $\lambda$ is the wavelength of the electromagnetic wave and $n_e$ is the equivalent refractive index of the waveguide 107. Further, in order to obtain the oscillation mode with a guide wavelength of $\lambda g$, as is known in the field of the semiconductor laser technology, a length L in a longitudinal direction of the waveguide 107 which is a propagation direction of the electromagnetic wave, is set to be an integral multiple of $\lambda g/2$.

The core layer 102 includes an active layer 101 which is a semiconductor portion having a multiple quantum well structure for generating terahertz wave by intersubband transition of a carrier, and has an electromagnetic wave gain in the frequency band of terahertz wave. As the active layer 101, for example, a resonant tunnel structure or a quantum cascade laser structure having a semiconductor multilayer structure of several hundreds to several thousands of layers is suitable. This embodiment is described as a case in which a resonant tunnel diode (RTD) is used as the active layer 101. An RTD has an electromagnetic wave gain in the frequency band of millimeter wave to terahertz wave based on the photon-assisted tunneling phenomenon in the negative differential resistance region. In the core layer 102, a heavily doped semiconductor layer for connecting the active layer 101 to the second metal layer 104 and to the first metal layer 103 may be provided above and below the active layer 101, respectively.

As described above, the second metal layer 104 and the first metal layer 103 are placed above and below the core layer 102, respectively. The first metal layer 103, the core layer 102, and the second metal layer 104 are laminated in the stated order from the side of the substrate 105. The core layer 102 is mechanically and electrically in contact with the first metal layer 103 and the second metal layer 104. This allows the RTD which is the active layer 101 to be driven by voltage applied between the first metal layer 103 and the second metal layer 104. The first metal layer 103 has a minute depressed and projected structure which extends in the in-plane direction thereof and in which a depressed portion and a projected portion are periodically arranged. The depressed and projected structure as used herein refers to, for example, a groove, a hole, a columnar structure, a protruding structure, or a recess structure not passing through the metal layer, which is formed in a part of the metal layer. In other words, the first metal layer 103 has a pattern of the depressed and projected structure formed therein which extends in the in-plane direction. For example, in the case illustrated in FIGS. 1A to 1C, projected structures 109 and depressed structures 110 in the depressed and projected structure correspond to metal portions and through holes in the thickness direction, respectively. In this case, the first metal layer 103 is formed of multiple bumps arranged in a matrix pattern. A metal film having a pattern of a depressed and projected structure is more prone to plastic deformation than a smooth and continuous metal film, and thus, through use of the first metal layer 103 as a bonding layer as in this embodiment, bonding at a lower temperature under a lower load can be carried out.

In particular, this embodiment is characterized by the depressed and projected structure. More specifically, it is characterized by the following three features: (1) the depressed and projected structure is arranged in a direction perpendicular to the propagation direction of the electromagnetic wave in the waveguide mode, and has plural projected portions; (2) the pitch length of the depressed and projected structure is less than $\lambda g/2$ where $\lambda g = \lambda/n_e$, $\lambda$ is the wavelength of the electromagnetic wave, and $n_e$ is the equivalent refractive index of the waveguide; and (3) the pitch length of the depressed and projected structure is less than 100 µm. By providing such a structure, the depressed and projected structure may be regarded as a structure in which an influence of reflection, scattering, refraction, and the like on the electromagnetic wave in the waveguide mode is negligible.

As the pattern of the depressed and projected structure, a structure which is minute and has a high aspect ratio (the ratio of the length in a height direction to the length in a lateral direction) is preferred. This is because, in such a structure, a stress is liable to concentrate, and dislocation line in plastic slip is liable to disappear, and thus, the structure becomes more prone to plastic deformation. More specifically, it is preferred that the widths and the heights of the depressed portion and the projected portion of the depressed and projected structure in the respective directions be in a range of about 100 µm to about 0.1 µm. The upper limit is determined from the fact that the thickness of a thin film which may be formed in a semiconductor manufacturing process is estimated to be about 100 µm. The lower limit is determined from the fact that the waveguide 107 functions as a plasmon waveguide when the thickness of the first metal layer 103 is equal to or larger than the depth of the skin depth of the terahertz wave (about 0.2 µm). Further, when the aspect ratio is equal to or higher than 0.5, the structure is more prone to plastic deformation. However, the present invention is not limited thereto, and a certain degree of effect is expected insofar as the pattern of the depressed and projected structure is formed in the first metal layer 103.

It is preferred that the pattern of the depressed and projected structure be sized to be the guide wavelength $\lambda g$ in the oscillation mode of the oscillator 100 or smaller, and typically, a range from $\lambda g/2$ to $\lambda g/20$ is suitable. This is equivalent to a range of 100 µm to 0.1 µm in the frequency band of the terahertz wave in which the oscillator 100 according to this embodiment operates, and is substantially coincident with the range mentioned above. The reason is that since a structure sized to be 1/10 of the wavelength can be generally regarded as a structure in which an influence of reflection, scattering, refraction, and the like on the electromagnetic wave in the wavelength is negligible, the influence of the depressed and projected structure on a resonance electric field can be reduced. Further, with regard to the pattern of the depressed portions and the projected portions in the depressed and projected structure, the depressed portions and the projected portions may be periodically arranged with reference to the resonance electric field in the oscillation mode. For example, when the depressed portions in the depressed and projected structure are arranged at locations which are to be nodes in the resonance electric field, the influence on the resonance electric field may be reduced irrespective of the size of the depressed and projected structure, and thus, an improvement in the oscillation characteristics is expected. For example, in the case illustrated in FIGS. 1A to 1C, the depressed structures 110 are periodically arranged with a pitch of $\lambda g/2$ at locations which are to be nodes in the resonance electric field in the oscillation mode.

A structure in which metal thin films sandwich a semiconductor thin film as in a DMW structure may be formed using a thin film transfer process in which a semiconductor thin film grown on a certain substrate is transferred onto another substrate using a metal bonding technology or the like. During this manufacturing process, a thermal stress due to a thermal expansion coefficient difference or a stress concentration around a bonded interface may cause strain in the semiconductor thin film. For example, thermal hysteresis of the manufacturing process may cause a residual stress in a range of about ±1 GPa (residual strain in a range of about 0.1 to 1%) in the semiconductor thin film. In the element according to this embodiment, the first metal layer 103 having the minute depressed and projected structure provided therein which is prone to plastic deformation is used as the bonding layer, and thus, the transfer process mentioned above may be carried out at a lower temperature under a lower load. Further, by devising the size and arrangement of the depressed portions and the projected portions in the depressed and projected structure, the influence of the DMW on the resonance electric field is suppressed. This enables reduction of transfer-caused residual strain of the active layer 101, which has been a problem to be solved, while maintaining the resonant structure. Therefore, it is expected to realize an element which operates stably in a frequency band such as the terahertz wave band.

FIGS. 2A to 2G are views illustrating modified examples of the element of this embodiment. According to the present invention, the structure may be such that a pattern of multiple grooves is formed in the first metal layer 103 (blind grooves 210 and 310 which are halfway dug through the first metal layer 103 in the thickness direction) like an oscillator 200 or an oscillator 300, or may be such that the first metal layer has a pattern of multiple hollow portions 410 like an oscillator 400. In the structures of the oscillator 200 and the oscillator 400, the first metal layer in contact with the core layer is smooth, and, irrespective of the arrangement and the size, the influence of the depressed and projected structure (including projected portions 209, 309, or 409) on the resonance electric field is reduced. In this case, when the smooth portion of the first metal layer is deeper than the skin depth of the terahertz wave, the influence on the resonance electric field is further reduced.

Further, like oscillators 500 and 700, the structure may be such that the core layer is discontinuous, and, like an oscillator 600 and the oscillator 700, the structure may be such that the second metal layer also has a depressed and projected structure arranged therein. Further, when the core layer is discontinuous, by arranging therein a spacer 513 or a spacer 713 of a dielectric or an insulator, the element becomes mechanically more stable. In FIGS. 2A to 2G, the first metal layer has projected portions 509, 609, or 709 and depressed portions 510, 610, or 710, and the second metal layer has projected portion 611 or 711 and depressed portions 612 or 712. Further, when the structure is such that a first metal layer 803 is formed by fitting a metal layer 803a having projected structures into a metal layer 803b having depressed structures, as in an oscillator 800, the structure is prone to plastic deformation, and thus, bonding at a lower temperature under a lower load can be carried out.

An example of a method of manufacturing the waveguide is now described with reference to FIGS. 3A to 3D. This manufacturing method includes a step of bonding the semiconductor layer on the first substrate and the second substrate via the first metal layer having the depressed and projected structure. More specifically, by manufacturing with the following steps the element 100 and the waveguide to be a resonator of the element, which are described in this embodiment, strain and defect caused in the semiconductor in an initial stage or during operation due to the manufacturing process or the like can be reduced. When the semiconductor layer includes an active layer having an electromagnetic wave gain, the oscillator 100 including the waveguide as a resonator is manufactured. The waveguide includes clads composed of two conductor layers in proximity to each other so that the distance therebetween is equal to or smaller than the guide wavelength λg, and a core layer of a semiconductor layer placed between the conductor layers. The waveguide is manufactured in a process including the following steps (A) to (D); (A) a step of preparing a first substrate 121 having a semiconductor layer 120 on an upper surface thereof, (B) a step of bonding the semiconductor layer 120 on the first substrate 121 and a second substrate 122 via a first metal layer 123 having a depressed and projected structure, (C) a step of separating the first substrate 121 from the semiconductor layer 120, and (D) a step of forming a second metal layer 124 on an upper surface of the semiconductor layer 120 on the second substrate 122.

As described above, in this embodiment, even with a laminated structure of metal (conductor layer)/semiconductor portion/metal (conductor layer) which is a material including different kinds of films, a semiconductor film may be transferred at a relatively low temperature under a relatively low load. Therefore, an element in which strain and defect caused in the semiconductor portion due to the manufacturing process or the like are suppressed, and a method of manufacturing the element can be provided. Therefore, according to this embodiment, an oscillator or the like which operates stably in the frequency band of the terahertz wave is realized.

More specific examples are described in the following.

EXAMPLE 1

An oscillator according to Example 1 of the present invention is now described with reference to FIGS. 1A to 1C and FIGS. 3A to 3D. In this example, as the active layer 101 having the multiple quantum well structure for generating terahertz wave by intersubband transition, an InGaAs/InAlAs-based resonant tunnel diode structure which is in lattice matching with an InP substrate was used. The active layer 101 has a semiconductor multilayer structure in which n-InGaAs (50 nm, Si, $1\times10^{18}$ cm$^3$), InGaAs (5 nm), AlAs (1.3 nm), InGaAs (7.6 nm, *), InAlAs (2.6 nm), InGaAs (5.6 nm, *), AlAs (1.3 nm), InGaAs (5 nm), and n-InGaAs (50 nm, Si, $1\times10^{18}$ cm$^{-3}$) are laminated in the stated order from the top. The InGaAs layers with the asterisk (*) after the thicknesses thereof are to be quantum well layers, while InAlAs-based materials without the asterisk (*) are to be potential barrier layers to form a triple barrier resonant tunnel structure. The AlAs layers which are not in lattice matching to the InP substrate are thinner than a critical thin film and are high energy barriers. Further, the n-InGaAs layers at the top and at the bottom which are doped with a high density carrier are emitter/collector layers for injecting/extracting electrons into/from the resonant tunnel structure. The InGaAs (5 nm) layers placed between the emitter/collector layers and the potential barrier layers are layers for preventing diffusion of Si as a doping material.

The core layer 102 includes the above-mentioned active layer 101 and the n-InGaAs layers ($1\times10^{19}$ cm$^{-3}$) which are placed above and below the active layer 101 and which are doped with the high density carrier. The doping layers connect the core layer 102 and the first metal layer 103 and the second metal layer 104 placed above and below the core layer 102, respectively, with relatively low resistance. Each of the first metal layer 103 and the second metal layer 104 includes a Ti/Pd/Au laminated films. The first metal layer 103 is Ti/Pd/Au/Pd/Ti (having thicknesses of 20 nm/20 nm/20,200 nm/20 nm/20 nm, respectively) and the second metal layer 104 is Ti/Pd/Au (having thicknesses of 20 nm/20 nm/200 nm, respectively). The substrate 105 is a GaAs substrate doped with high density carrier, and is mechanically and electrically connected to the first metal layer 103. The oscillator 100 is connected via the second metal layer 104, the first metal layer 103, and the substrate 105 to a power supply, and a bias voltage for driving is supplied thereto. With the structure described above, the oscillator 100 generates electromagnetic wave in the frequency band of millimeter wave to terahertz wave based on the photon-assisted tunneling phenomenon in the negative differential resistance region.

The waveguide 107 has a Fabry-Perot resonator structure, and includes at least two end faces in the propagation direction of the electromagnetic wave. The length L in the propagation direction of the waveguide 107 (longitudinal direction of the waveguide 107) for causing the electromagnetic wave to be standing wave using reflection from the end faces is a factor in determining the oscillation wavelength. In this example, the length L of the waveguide 107 is 1 mm, which is 20 times as large as λg, and the width of the waveguide 107 is 0.05 mm. Therefore, the second metal layer 104 is in a rectangular pattern of 1 mm×0.05 mm.

The minute depressed and projected structure in which the projected portions and the depressed portions are periodically arranged is formed in the first metal layer 103. In this example, the projected structures 109 correspond to metal portions and the depressed structures 110 correspond to through holes. A pitch length is the sum of the length of a depressed portion and the length of a projected portion. The pitch length in parallel with the propagation direction of the electromagnetic wave in the waveguide mode is represented by PL1, and the pitch length in a direction perpendicular to the propagation direction within the plane is represented by PL2.

The projected structure 109 has a bump structure of Au having a width in the longitudinal direction of the waveguide 107 of 24 μm, a width in the lateral direction of the waveguide 107 of 24 μm (in the shape of a square), and a height of 20 μm. Forty projected structures 109 are arranged in the longitudinal direction of the waveguide 107 with the pitch length being 25 μm (λg/2), and two projected structures 109 are arranged in the lateral direction of the waveguide 107 with the pitch length being 25 μm (λg/2). In this way, the depressed and projected structure is provided so as to extend in the lateral direction which is perpendicular to the propagation direction of the electromagnetic wave in the waveguide mode. Note that, in FIGS. 1A to 1C, the numbers of the projected structures 109 and the depressed structures 110 are reduced for the sake of easy understanding of the characteristics of the structure. The depressed structures 110 are arranged at locations which are to be nodes in the resonance electric field in the oscillation mode of the oscillator 100. In this example, the end faces of the waveguide 107 are open ends, and the location of $\lambda g/4$ from an end face is the location of the first node in the resonance electric field. The depressed structures 110 may be formed of vacuum, a gas such as air, or a low loss material in the terahertz wave band (for example, a resin such as BCB or an inorganic material such as $SiO_2$). The distance between the first metal layer 103 and the second metal layer 104 is about 1 µm. In the waveguide 107 in this example, the electromagnetic wave propagates through the thin intrinsic semiconductor layer of the active layer 101 in the surface plasmon mode. In this example, the equivalent refractive index of the waveguide when the oscillation frequency is 0.3 THz is designed to be about 20, and the guide wavelength $\lambda g$ in the oscillation mode is designed to be 50 µm. Thus, the size of the projected structure 109 is approximately equivalent to $\lambda g/2$, the pitch length is equivalent to $\lambda g/2$, and the size of the depressed structure 110 is approximately equivalent to $\lambda g/50$.

A method of manufacturing the oscillator 100 according to the present invention is now described with reference to FIGS. 3A to 3D.

(A) As the first substrate 121, an InP substrate having a semiconductor layer 120 epitaxially grown thereon is prepared. The semiconductor layer 120 corresponds to the core layer 102 including the active layer 101 illustrated in FIGS. 1A to 1C.

(B) A metal layer (Ti/Pd/Au (having thicknesses of 20 nm/20 nm/20,000 nm, respectively)) which is patterned by photolithography, vacuum deposition, and electroplating is formed on the upper surface of the first substrate 121 (surface having the semiconductor layer 120 placed thereon). A metal layer (Ti/Pd/Au (having thicknesses of 20 nm/20 nm/200 nm, respectively)) which is patterned by photolithography and vacuum deposition is formed on the upper surface of the second substrate 122. The upper surfaces of the first substrate 121 and the second substrate 122 are caused to face each other, and, after the surfaces of the Au bumps and the Au thin film are activated by Ar high frequency plasma, are bonded to each other under pressure at room temperature. The Ti/Pd/Au/Pd/Ti layer (having thicknesses of 20 nm/20 nm/20,200 nm/20 nm/20 nm, respectively)) formed here by the bonding under pressure is to be the first metal layer 123. The first metal layer 123 has a projected structure 129 which is an Au bump of a 24 µm square with a height of 20 µm, and a depressed structure 130 which is a through hole. The second substrate 122 is a conductive GaAs substrate, and corresponds to the substrate 105 illustrated in FIGS. 1A to 1C.

(C) The InP substrate is removed from the integral substrate by grinding and hydrochloric acid etching to separate the semiconductor layer 120 from the first substrate 121 to transfer it onto the second substrate 122.

(D) The semiconductor layer 120 and the first metal layer 123 are shaped by photolithography and dry etching. Vacuum deposition and lift-off are used to form the second metal layer 124 of Ti/Pd/Au (having thicknesses of 20 nm/20 nm/200 nm, respectively).

The element in this example also obtains the effect mentioned above, and strain and defect caused in the semiconductor in an initial stage or during operation due to the manufacturing process or the like are suppressed, and thus, improvement and stability of characteristics such as oscillation characteristics are realized.

The present invention is not limited to the above-mentioned structure of this example, and modified examples described below are also possible. For example, in this example, the active layer 101 described above is a triple barrier resonant tunnel diode formed of InGaAs/InAlAs and InGaAs/AlAs grown on an InP substrate. However, the present invention is not limited to such structure and materials, and other structures and other combinations of materials may also provide a semiconductor element. For example, a resonant tunnel diode having a double barrier quantum well structure, a resonant tunnel diode having a multiple barrier quantum well structure of quadruple or more, a multiple quantum well structure having cascade connections as is known by a quantum cascade laser, or the like may also be used. With regard to the combination of materials, GaAs/AlGaAs, GaAs/AlAs, or InGaAs/GaAs/AlAs formed on a GaAs substrate, InGaAs/AlGaAsSb formed on an InP substrate, InAs/AlAsSb or InAs/AlSb formed on an InAs substrate, SiGe/SiGe formed on a Si substrate, or the like may also be used. The structure and the materials may be appropriately selected depending on the desired frequency and the like.

Further, in this example, the description is made on the assumption that the carrier is electrons. However, the present invention is not limited thereto, and positive holes (holes) may also be used. Further, the material of the substrate may be selected depending on the application purpose, and a semiconductor substrate such as a silicon substrate, a gallium arsenide substrate, an indium arsenide substrate, or a gallium phosphorus substrate, a glass substrate, a ceramic substrate, a resin substrate, or the like may also be used. Further, as the first metal layer 103 and the second metal layer 104, a metal (Ag, Au, Cu, Al, a AuIn alloy, or the like) or a semimetal (Bi, Sb, ITO, ErAs, or the like) may be suitably used. It is to be understood that a heavily doped semiconductor may be used as the conductor. Further, as the spacers 513 or 713, an inorganic material such as $SiO_2$, TEOS, polysilicon, $SiN_x$, AlN, or $TiO_2$ or an organic material such as BCB (benzocyclobutene), SU-8, or a polyimide is suitably used. Further, a low conductive intrinsic semiconductor which is regrown may also be used. Those modified examples are similarly applicable to other embodiments and examples.

EXAMPLE 2

Figure 4A:
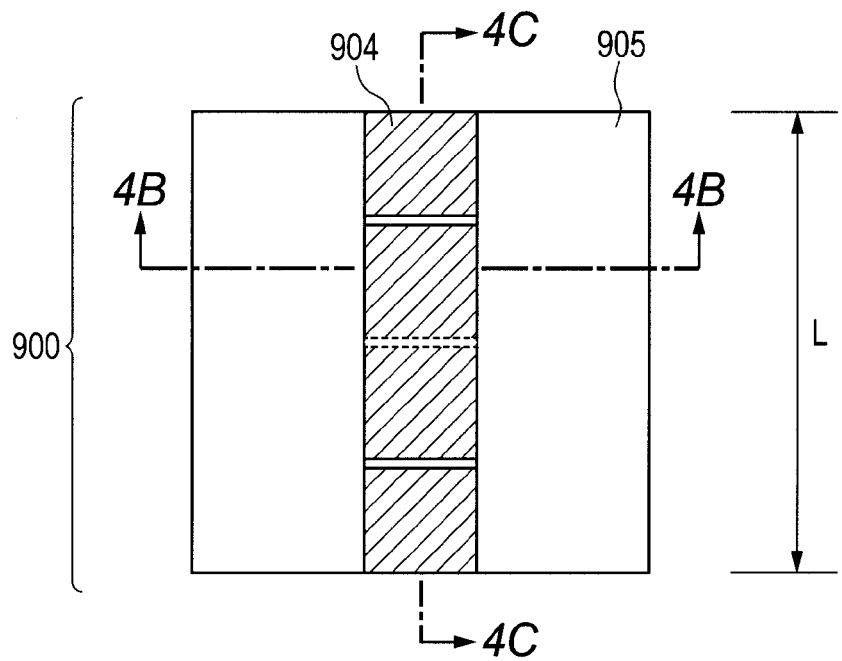
FIGS. 4A, 4B and 4C are views illustrating an element according to Example 2 of the present invention.
Figure 4B:
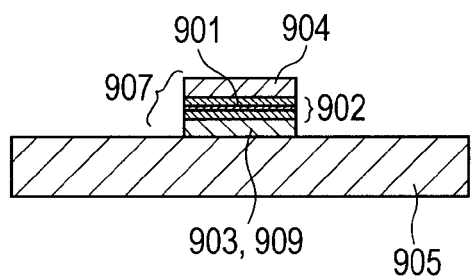
Figure 4C:
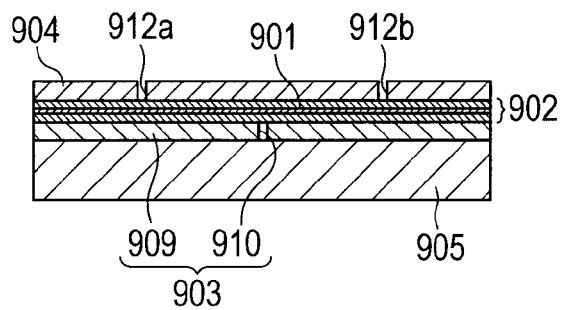

An oscillator 900 according to Example 2 of the present invention is now described with reference to FIGS. 4A to 4C. An active layer 901 uses the quantum cascade laser structure disclosed in Appl. Phys. Lett. 83, 2124 (2003). A core layer 902 including the active layer 901 is a semiconductor thin film of a thickness of about 10 µm. With regard to a first metal layer 903 and a second metal layer 904 and other components, the structure disclosed in Appl. Phys. Lett. 83, 2124 (2003) is used. The second metal layer 904 is in a rectangular pattern of about 2.6 mm×0.15 mm, and is designed to obtain oscillation of about THz. Note that, in this structure, the equivalent refractive index of a waveguide 907 when the oscillation frequency is 3 THz is about 3, and the guide wavelength $\lambda g$ is about 30 µm.

In this example, a groove of 3 µm×150 µm is formed in the first metal layer 903 on a substrate 905 at a location which is about 1.3 mm from both end faces of the waveguide 907, that is, in the middle of the waveguide 907, as a depressed structure 910 between projected structures 909. Further, rectangular grooves of 9 µm×150 µm are formed in the second metal layer 904 at locations which are about 0.65 mm from both end faces, respectively, of the waveguide 907 as depressed structures 912a and 912b. Portions other than the depressed structures 912a and 912b are projected structures 901. As in this example, insofar as the depressed structure 910 is formed such that the size thereof is equal to or smaller than $\lambda g/2$ where $\lambda g$ is the guide wavelength, irrespective of the location of the depressed structure 910, the influence on the resonance electric field is suppressed. Further, the size of the projected structures 909 is equal to or larger than the guide wavelength λg, and thus, the waveguide 907 may realize both excellent light confinement and low loss propagation. Therefore, with the structure of this example, both stabilization of the oscillation mode of the waveguide 907 and reduction of strain in the active layer may be anticipated, and thus, improvement and stabilization of the oscillation characteristics are expected.

EXAMPLE 3

Figure 5A:
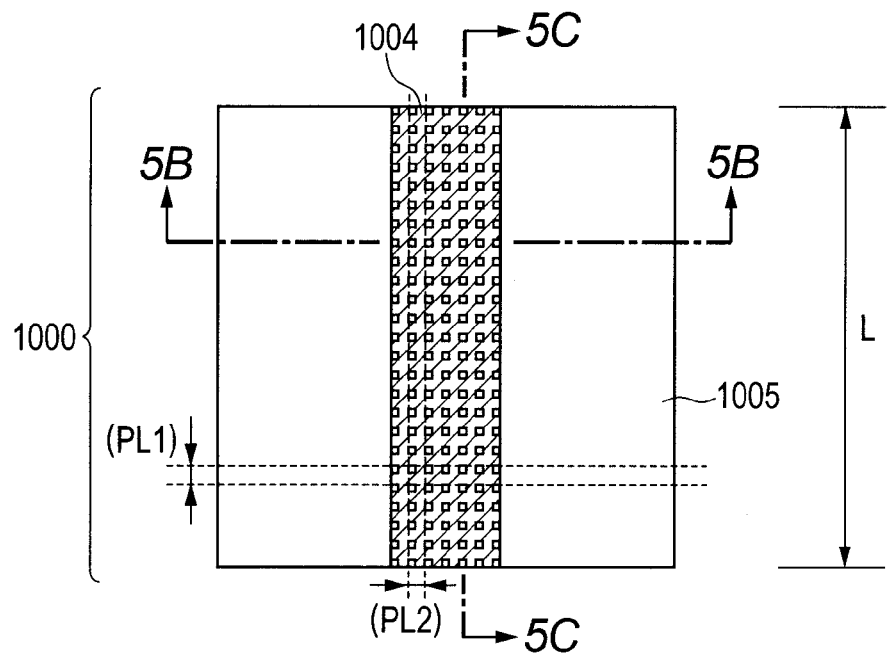
FIGS. 5A, 5B and 5C are views illustrating an element according to Example 3 of the present invention.
Figure 5B:
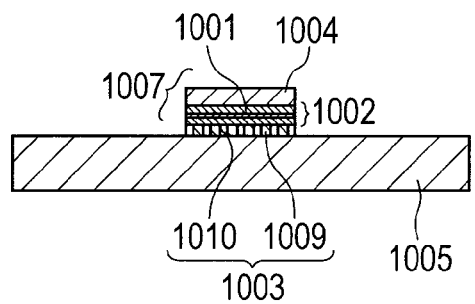
Figure 5C:
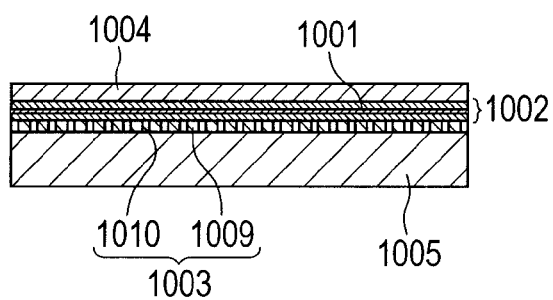

An oscillator 1000 according to Example 3 of the present invention is now described with reference to FIGS. 5A to 5C. An active layer 1001 of a core layer 1002 has a resonant tunnel diode structure similarly to the case of Example 1, and, with regard to a first metal layer 1003 and a second metal layer 1004 and other components, the same structure as that in Example 1 is used. The second metal layer 1004 is in a rectangular pattern of about 1 mm×0.05 mm, and is designed to obtain oscillation of about 0.3 THz. Note that, in FIGS. 5A to 5C, the numbers of projected structures 1009 and depressed structures 1010 are reduced.

In the first metal layer 1003 on a substrate 1005 of this example, as the projected structures 1009, rectangular Au thin film patterns of 1 μm×1 μm are arranged in the longitudinal direction and in the lateral direction of a waveguide 1007 with the pitch length being 1.5 μm (λg/20). In this case, the width of the projected structures 1009 is approximately equivalent to λg/50 and the size of the depressed structures 1010 is approximately equivalent to λg/100. When a depressed and projected structure, the size of which is equal to or smaller than λg/2, more specifically, equal to or smaller than λg/20, is used in this way, the influence of reflection, scattering, refraction, and the like in the structure on the electromagnetic wave in the wavelength is negligible, and thus, the influence of the depressed and projected structure on the resonance electric field is reduced, and design flexibility of the oscillator of this example becomes greater.

In the element in this example, also, strain and a defect caused in the semiconductor in an initial stage or during operation due to the manufacturing process or the like are suppressed, and thus, improvement and stability of characteristics such as oscillation characteristics are realized.

EXAMPLE 4

Figure 6A:
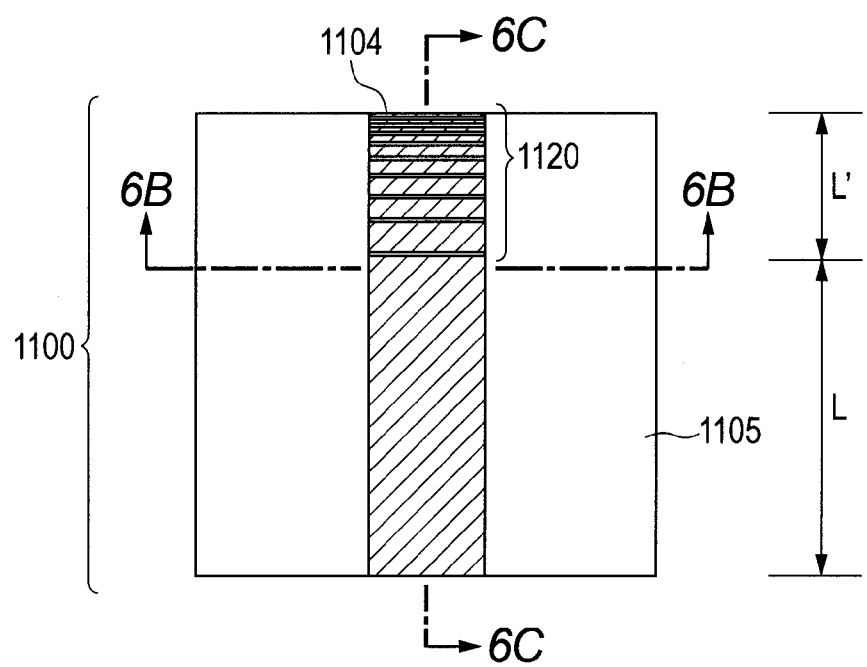
FIGS. 6A, 6B and 6C are views illustrating an element according to Example 4 of the present invention.
Figure 6B:
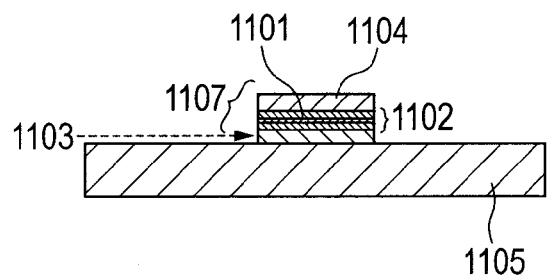
Figure 6C:
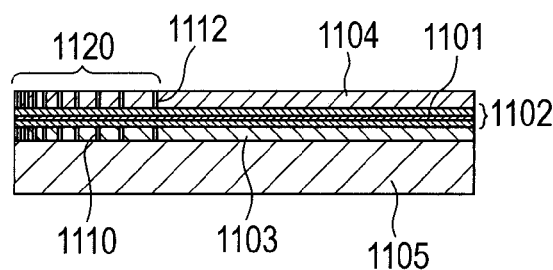

An oscillator 1100 according to Example 4 of the present invention is now described with reference to FIGS. 6A to 6C. An active layer 1101 of a core layer 1102 has a resonant tunnel diode structure similarly to the case of Example 1, and, with regard to a first metal layer 1103 and a second metal layer 1104 and other components, the same structure as that in Example 1 is used. The second metal layer 1104 is in a rectangular pattern of about 1 mm×0.05 mm, and is designed to obtain oscillation of about 0.3 THz. Note that, in FIGS. 6A to 6C, the numbers of projected structures 1109 and depressed structures (slits) 1110 are reduced.

In this example, in a region 1120 in proximity of one end face of a waveguide 1107, as a depressed and projected structure which extends in the in-plane direction, a large number of slits 1110 and 1112 are arranged in the first metal layer 1103 and the second metal layer 1104, respectively. The slits 1110 and 1112 are grooves of 2 μm×50 μm, and, in this example, are filled with BCB.

The slits 1110 and 1112 are arranged so that the number thereof per unit length gradually increases toward the end face. In other words, the coarseness and fineness of depressed portions and projected portions in the first metal layer 1103 and the second metal layer 1104 of the waveguide 1107 gradually changes in proximity to the end face of the waveguide. More specifically, the slits 1110 and 1112 are arranged so that the number per 50 μm-length of the slits 1110 and 1112 each having a width of 2 μm increases to be 1, 2, 5, 10, and 25 with an increment of 50 μm pitch. In this case, L'=250 μm. In the structure of this example, in the region 1120, the equivalent refractive index gradually decreases toward the end face, and thus, the structure is suitable for impedance matching between the waveguide 1107 and the outside, and an improvement in extraction efficiency of the oscillator is expected. The outside of the waveguide as used herein refers to, for example, a free space, a transmission line, or a dielectric having a low dielectric constant. Further, in another modified example of the present invention, the effective refractive index of the waveguide can be partially changed by partially changing the coarseness and fineness of the depressed portions and the projected portions of at least one of the first metal layer 1103 and the second metal layer 1104.

Figure 7:
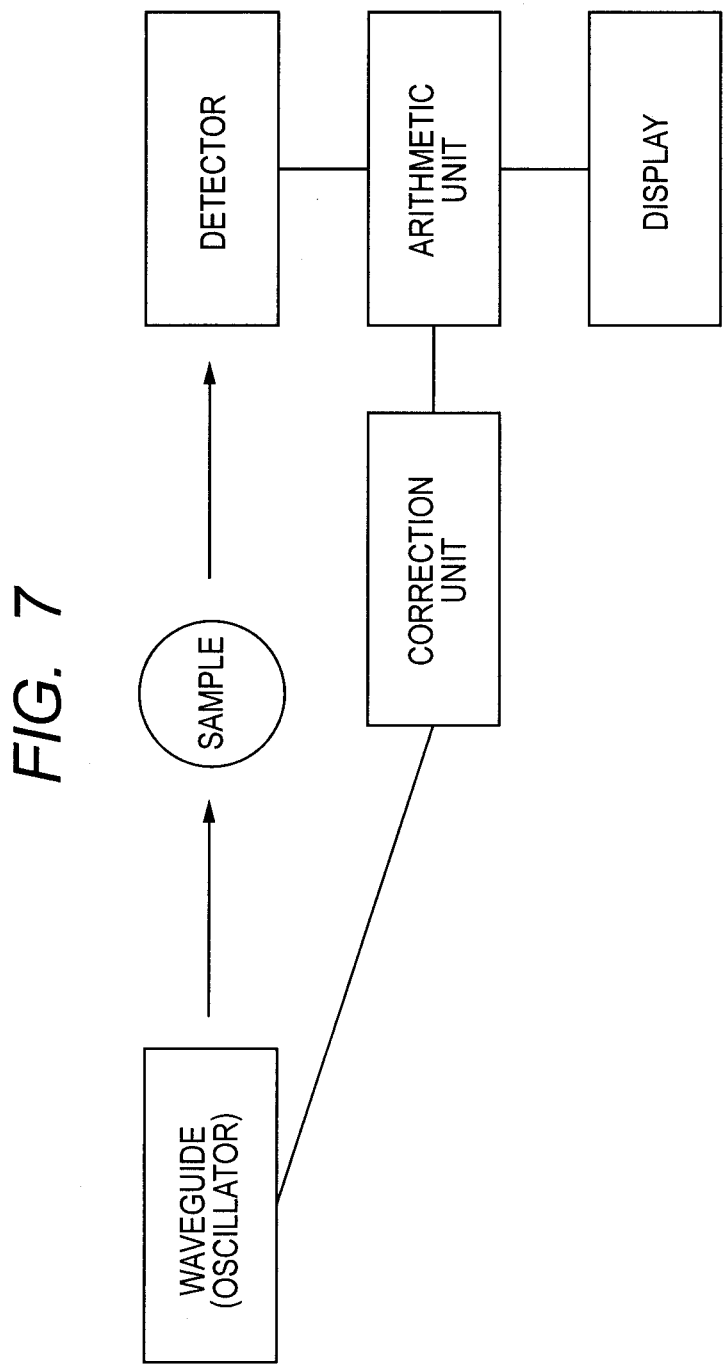
FIG. 7 is a view illustrating an application example using the element according to the embodiment and the examples of the present invention.

With the structure of this example, both stabilization of the oscillation mode of the waveguide 1107 and reduction of strain in the active layer are anticipated, and thus, improvement and stabilization of the oscillation characteristics are expected. Further, in a DMW, reflection at an end face increases and the beam pattern diverges due to mode mismatch between the waveguide and space, and thus, a DMW has a problem in efficient use and routing of the beam from the viewpoint of applicability. With the structure according to the present invention, a highly efficient waveguide with which impedance matching between the waveguide and the outside is easily achieved may be provided. Further, an apparatus illustrated in FIG. 7 may be provided using the waveguide described above in combination with an arithmetic unit for calculating the state of a sample and the like. For example, the waveguide is used as an oscillator, and a sample is placed at an end of the waveguide. The sample interacts with electromagnetic wave transmitted from the waveguide, and thus, some influence is exerted on the transmitted electromagnetic wave. The electromagnetic wave applied to the sample is reflected by or passes through the sample, which is detected by a detector. After that, the arithmetic unit such as a personal computer calculates the state of the sample based on a detection signal. More specifically, application to an industrial inspection apparatus for inspecting the condition of a medicine or the like is supposed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-110888, filed May 17, 2011, which is hereby incorporated by reference herein in its entirety.

What is claimed is:

1. A waveguide, comprising:
   a first conductor layer and a second conductor layer that are composed of a negative dielectric constant medium having a negative real part of dielectric constant with respect to an electromagnetic wave in a waveguide mode; and
   a core layer that is in contact with and placed between the first conductor layer and the second conductor layer, and includes a semiconductor portion,
   wherein at least the first conductor layer has a depressed and projected structure, wherein, in the depressed and projected structure, a depressed portion being depressed in a thickness direction of the first conductor layer is arranged between adjacent projected portions in an in-plane direction of the first conductor layer, and wherein the depressed portion is arranged between the adjacent projected portions in the in-plane direction of the first conductor layer perpendicular to a propagation direction of the electromagnetic wave in the waveguide mode.

2. The waveguide according to claim 1, wherein depressed portions and projected portions of the depressed and projected structure have a width equal to or less than $\lambda g/2$ where $\lambda g=\lambda/ne$, where $\lambda$ is a wavelength of the electromagnetic wave, and ne is an equivalent refractive index of the waveguide.

3. The waveguide according to claim 1, wherein depressed portions and projected portions of the depressed and projected structure are periodically arranged.

4. The waveguide according to claim 1, wherein depressed portions of the depressed and projected structure are arranged at least at locations which are to be nodes in a resonance electric field in an oscillation mode.

5. The waveguide according to claim 1, wherein the second conductor layer has a depressed and projected structure extending in the in-plane direction.

6. The waveguide according to claim 1, wherein the core layer has a multiple quantum well structure for generating a terahertz wave by intersubband transition of a carrier.

7. The waveguide according to claim 1, wherein a substrate, the first conductor layer, the core layer, and the second conductor layer are laminated in this order.

8. The waveguide according to claim 1, wherein the depressed and projected structure has a coarseness and fineness that gradually changes in proximity to an end face of the waveguide.

9. An apparatus using an electromagnetic wave, comprising:
the waveguide as defined in claim 1; and
an arithmetic unit for detecting the electromagnetic wave which has interacted with a sample and calculating a state of the sample based on a detection signal.

10. A method of manufacturing the waveguide as defined in claim 1, the method comprising:
preparing a first substrate having a semiconductor layer on an upper surface thereof;
transferring the semiconductor layer onto an upper surface of a second substrate via a first conductor layer having a depressed and projected structure extending in an in-plane direction of the first conductor layer; and
forming a second conductor layer on an upper surface of the semiconductor layer.

11. A method of manufacturing an oscillator including a waveguide manufactured by the method as defined in claim 10, wherein the semiconductor layer is formed as a semiconductor layer having an electromagnetic wave gain, and the waveguide is formed as a resonator of the oscillator.

12. A waveguide, comprising:
a first conductor layer and a second conductor layer that are composed of a negative dielectric constant medium having a negative real part of dielectric constant with respect to an electromagnetic wave in a waveguide mode; and
a core layer that is in contact with and placed between the first conductor layer and the second conductor layer, and includes a semiconductor portion,
wherein at least the first conductor layer has a depressed and projected structure,
wherein, in the depressed and projected structure, a depressed portion being depressed in a thickness direction of the first conductor layer is arranged between adjacent projected portions in an in-plane direction of the first conductor layer, and
wherein the depressed and projected structure has a pitch length less than $\lambda g/2$ where $\lambda g=\lambda/ne$, where $\lambda$ is a wavelength of the electromagnetic wave, and ne is an equivalent refractive index of the waveguide.

13. A waveguide, comprising:
a first conductor layer and a second conductor layer that are composed of a negative dielectric constant medium having a negative real part of dielectric constant with respect to an electromagnetic wave in a waveguide mode; and
a core layer that is in contact with and placed between the first conductor layer and the second conductor layer, and includes a semiconductor portion,
wherein at least the first conductor layer has a depressed and projected structure,
wherein, in the depressed and projected structure, a depressed portion being depressed in a thickness direction of the first conductor layer is arranged between adjacent projected portions in an in-plane direction of the first conductor layer, and
wherein the depressed and projected structure has a pitch length less than 100 μm and the depressed and projected structure has a coarseness and fineness that gradually changes in proximity to an end face of the waveguide.

* * * * *